(12) United States Patent
Nguyen et al.

(10) Patent No.: US 6,205,252 B1
(45) Date of Patent: Mar. 20, 2001

(54) TWO CHANNEL HVQ (HIERARCHICAL VECTOR QUANTIZATION) COMPRESSION

(75) Inventors: Uoc H. Nguyen, Long Beach; Kien T. Nguyen, Torrance; Abraham E. Claproth, Culver City; Sang-chul Kang, Irvine; Chia-hao Lee, Hacienda Heights, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/106,581

(22) Filed: Jun. 29, 1998

(51) Int. Cl.[7] ............................. G06K 9/36; G06K 9/46
(52) U.S. Cl. ........................ 382/234; 382/240; 382/253
(58) Field of Search ........................... 382/232, 234, 382/237, 240, 244, 245, 246, 247, 248, 250, 251, 253; 348/396, 397, 398, 409, 414, 417, 418, 422; 358/261.3, 432; 375/240.22

(56) References Cited

U.S. PATENT DOCUMENTS

| | | | |
|---|---|---|---|
| 4,745,473 | * | 5/1988 | Hall ........................................ 348/396 |
| 5,140,417 | * | 8/1992 | Tanaka et al. ......................... 382/250 |
| 5,253,058 | * | 10/1993 | Gharavi ................................. 348/409 |
| 5,339,164 | * | 8/1994 | Lim ........................................ 382/253 |
| 5,689,588 | * | 11/1997 | Rombola et al. ..................... 382/237 |
| 5,764,802 | * | 6/1998 | Simon ................................... 382/232 |

OTHER PUBLICATIONS

Minami, CCITT H.261 Compatible Mixed Bit Rate Coding of Video for ATM Networks, 6/1992. p. 537–543, Communications, 1992, ICC '92, IEEE International Conference.*

Lo et al., A contour coding and full–frame compression of discrete wavelet and cosine transforms, 10/1995, p. 9–12, vol. 2. Image Processing, 1995. Proceedings., International Conference on.*

* cited by examiner

*Primary Examiner*—Amelia M. Au
*Assistant Examiner*—Timothy M. Johnson
(74) *Attorney, Agent, or Firm*—Robert Cunha

(57) ABSTRACT

A compression process of dividing each word to be compressed into least and most significant bits, and applying a different compression ratio to each. If the compression processes are lossy, both parts of the output can also be losslessly compressed before being output. Hierarchical vector quantization can be issued for either lossy compressor.

3 Claims, 7 Drawing Sheets area of Table 1 (2x2), Text area of Table 2 (2x2), Mixed area of Table 3 (4x2), Contone area of Table 1 (4x2), Text area of Table 2 (2x2), Mixed area of Table 3 (4x2), Contone

TWO CHANNEL HVQ (HIERARCHICAL VECTOR QUANTIZATION) COMPRESSION

A method of optimizing the compression ratio of a compression apparatus or method by splitting the data words into two segments of most and least significant bits, and applying different compression methods to each segment.

When data must be transmitted or stored it is usually compressed first, to reduce the transmission time or storage requirement. This is especially true of image data which can consist of four color separations of 8-bit pixels.

One method of compression is "hierarchical vector quantization" (HVQ), where a block of data can be reduced to a single codeword in a number of steps. This method is described in U.S. Pat. No. 5,602,589, and is incorporated by reference herein. This procedure can be explained most clearly by the use of a numerical example in connection with FIG. 1a of that patent. Assume that a 2 by 4 pixel block, 8 bits per pixel, is to be compressed to one 9-bit number. First, each pair of pixels is applied to a stage 1 look up table (LUT) containing 9-bit code words, each code word being associated with a two-pixel bit pattern. The table is set up so that if an exact match of the input pixel bits is not available, then a codeword associated with the closest match is output instead. The ultimate output of this stage 1 is four codewords, each describing the closest match to the bit pattern of the two input pixels. Since the exact match frequently is not possible, this compression is inherently lossy to some extent. The output of the first stage is four 9-bit codewords.

Assuming this amount of compression is not sufficient, these four codewords, each representing the bit pattern of a 1 by 2 pixel block are next applied to two stage 2 tables, resulting in a total of two 9-bit output codewords, each representing the bit pattern of a 2 by 2 pixel block. If the compression is still insufficient, these two are applied to the stage 3 table to yield the final output word, which is associated with a 2 by 4 pixel block. It can now be seen that this method is hierarchical in that a plurality of stages are used, it involves vectors since the input pixels have a directional relationship with each other, and is quantized in that a number of levels can be implemented to achieve any degree of compression.

For decompression, each codeword is simply applied to a 256 K by 64 bit LUT which outputs the bit pattern of the entire 8-pixel block.

SUMMARY OF THE INVENTION

In the prior art, it is understood that if two different kinds of data are to be compressed, it is most efficient to separate the data, text and contone, for example, and apply a different compression algorithm to each, to optimize the process. Here, the procedure is to separate each data word into its most and least significant parts, and apply a different compression procedure to each part. If an HVQ process is being used for both parts, the compression ratio for each part can be different to optimize the entire process.

With specific reference to HVQ compressors being used to compress 8-bit image pixels, the improvement of the basic HVQ circuit would be to divide each 8-bit pixel into three most significant bits (MSB's) and five least significant bits (LSB's), for example. Each channel is compressed by an HVQ compressor, and the final output of the decompressors are summed in an adder, mux, etc, to recombine them. The advantage of this procedure is that a different amount of compression can be applied to each portion. The three MSB's for example, contain the most crucial data, and so a less lossy compression of, for example, 4 to 1, can be applied while, for the LSB's, a greater loss can be absorbed so a compression of 16 to 1 can be used. The result is either less loss or greater compression, compared to the original system. This procedure improves the system performance of a compressor using HVQ, but can be used on systems using other compression algorithms as well.

DETAILED DESCRIPTION OF THE INVENTION

Figure 1:
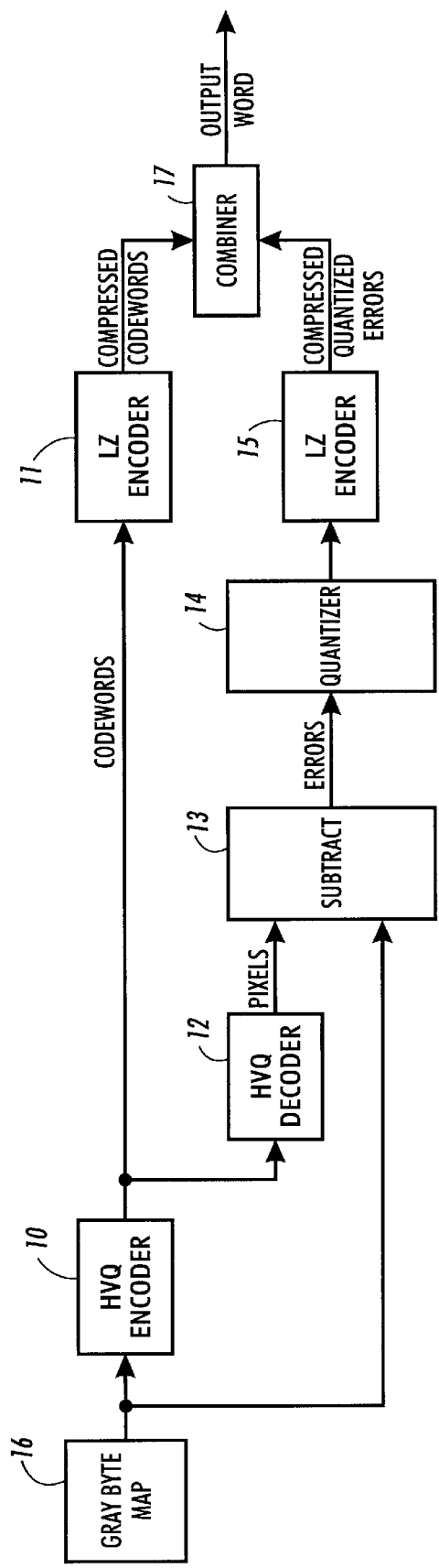
FIG. 1 is an HVQ encoder which has a parallel error channel.

The basic HVQ system can be improved by adding an error channel as shown in FIG. 1. In the upper channel the grayscale byte map 16 is applied in the usual way to an HVQ decoder 10, the output is losslessly compressed in an LZ encoder 11, and the result is sent to the decoder, usually in the form of 8 to 10-bit words.

In addition, the output of the HVQ encoder is sent to a decoder 12 in scanline format which produces a version of the original byte map which may be different from the original because of errors possibly introduced by the lossy encoder. The two byte maps are then subtracted 13, pixel by pixel, to produce error terms which, if added to the output codeword, will produce the original byte map. This subtraction can also be done by using an exclusive OR, which is simpler and faster and does not require a sign bit. These error terms, each a signed quantity 8-bits wide or less, can then be compressed in an LZ encoder 15 combined in combiner 17 with the compressed code words to produce an output word and sent to the decoder. The larger the error term, the less will be the compression ratio. In practice, small errors are not visually detectable. To limit the degradation of the compression ratio, the error term can be limited to a few most significant bits, three for example, in quantizer 14. Normally, the amount of error for a pixel will not be large enough to show up in the few MSB's, in which case there will be no error term at all.

Figure 2:
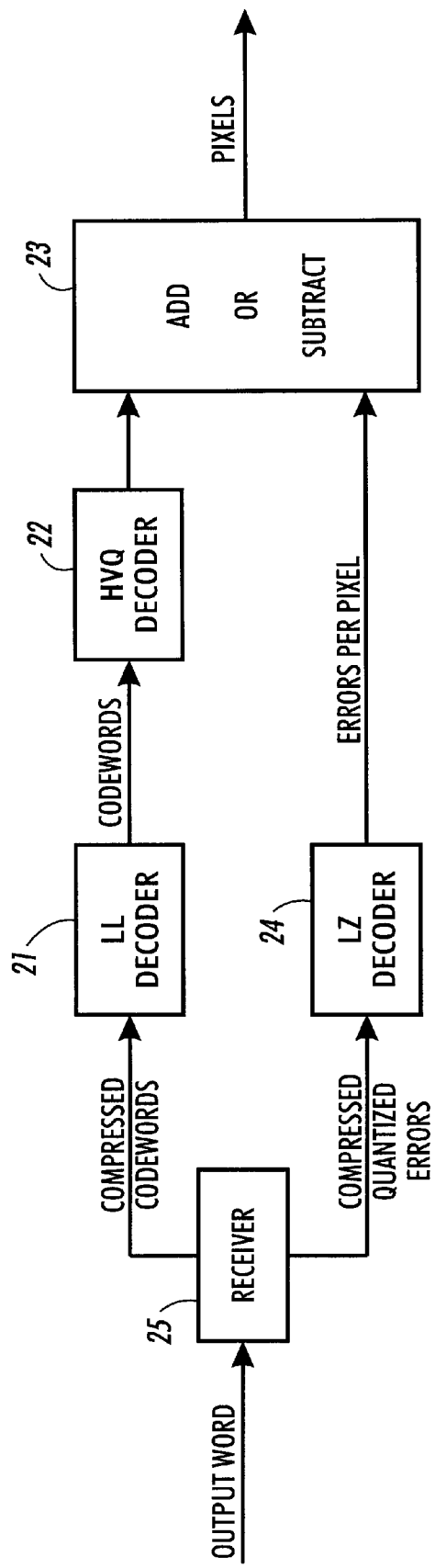
FIG. 2 is the decoder for the arrangement of FIG. 1.

The quantized error decoder is shown in FIG. 2. The output word from FIG. 1 is split into compressed code words and compressed quantized errors in receiver 25. The compressed code words are LZ decoded in decoder 21 and HVQ decoded in decoder 22 to produce one term for the adder 23. The compressed quantized errors are LZ decoded in decoder 24 and applied as the other term to the adder 23, the output of which is output video. The adder 23 can either be an adder adding a sign bit and seven bits, or an exclusive OR if one was used to generate the error term in the encoder.

Figure 3:
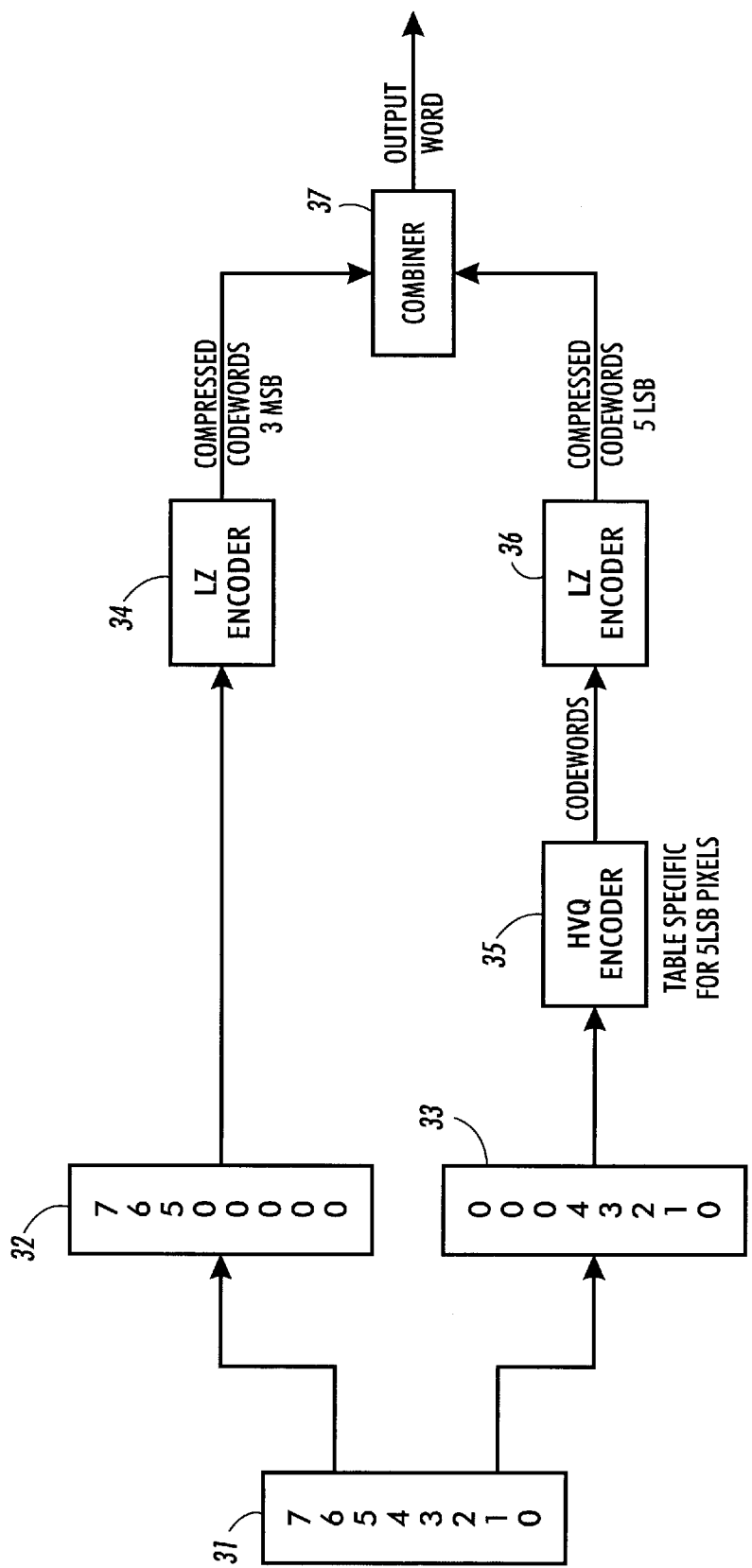
FIG. 3 is a one-channel arrangement for coding a pixel split into its most and least significant bits.
Figure 4:
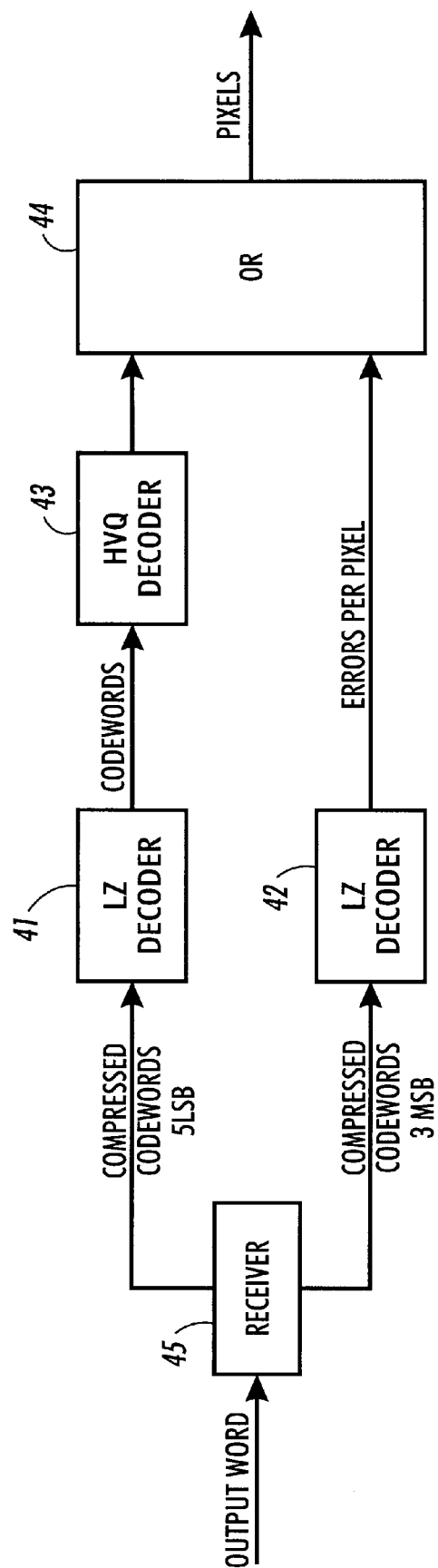
FIG. 4 is a one-channel arrangement for decoding a pixel split into its most and least significant bits.

FIG. 3 shows the arrangement when a single code word 31 is split into most and least significant parts, 32, 33, and where only the least significant bits are compressed. In this case bits 0 through 4 are sent through lossy compressor 35 while bits 5 through 7 are not. Both are then compressed using lossless LZ compression ,combinined in combiner 37 and output to the decoder shown in FIG. 4. The output word from FIG. 3 is split into least significant compressed code words and most significant compressed code words in receiver 25. Then, both channels are LZ decompressed while only the LSB's are HVQ decoded. The two resultant parts are then exclusive ORed 44 together to be applied to the decoding look up table.

Figure 5:
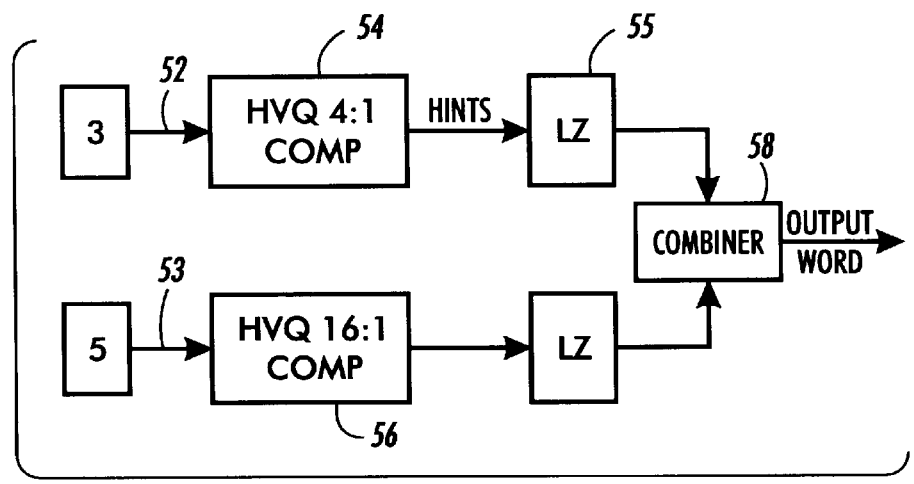
FIG. 5 is a two-channel arrangement for coding a pixel split into its most and least significant bits.

FIG. 5 is a system where a single pixel is separated into a least significant segment and a most significant segment, and where a separate and different compression process is used for each segment, the least significant bits being more compressed. The original pixel is separated into its most significant bits 52 and least significant bits 53. The result is that the most significant bits, being the most important, are less compressed while compression for the least significant bits has a better compression ratio. A programmable look-up table could be used to split the input pixel into any two segments other than the 3–5 split shown. The two compression results are combined in combiner 58 to produce an output word.

Figure 6:
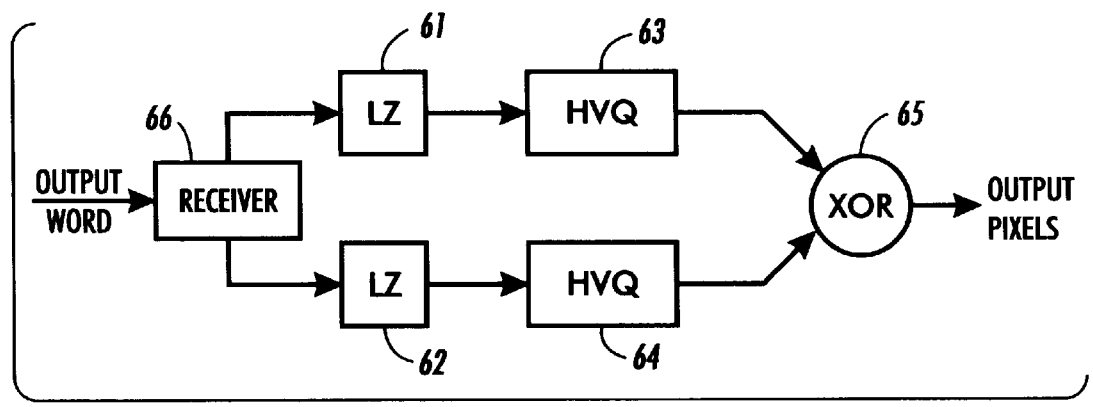
FIG. 6 is a decoder for the coder of FIG. 5.

FIG. 6 is the decoder for the encoder of FIG. 5. The output word is split into its least and most significant parts, applied to LZ decoders 61, 62 and HVQ 63, 64 decoders. Then both are applied to an exclusive OR gate 65 to assemble the entire pixel. Of course, if the encoder used some other combination of encoders, the decoder would use the same form of decoding. That is, more generally, the data words in a string can be divided into more and less significant bits to create two parallel strings, and then compressed using any two methods of compression where the greater compression is applied to less significant bits.

Figure 7:
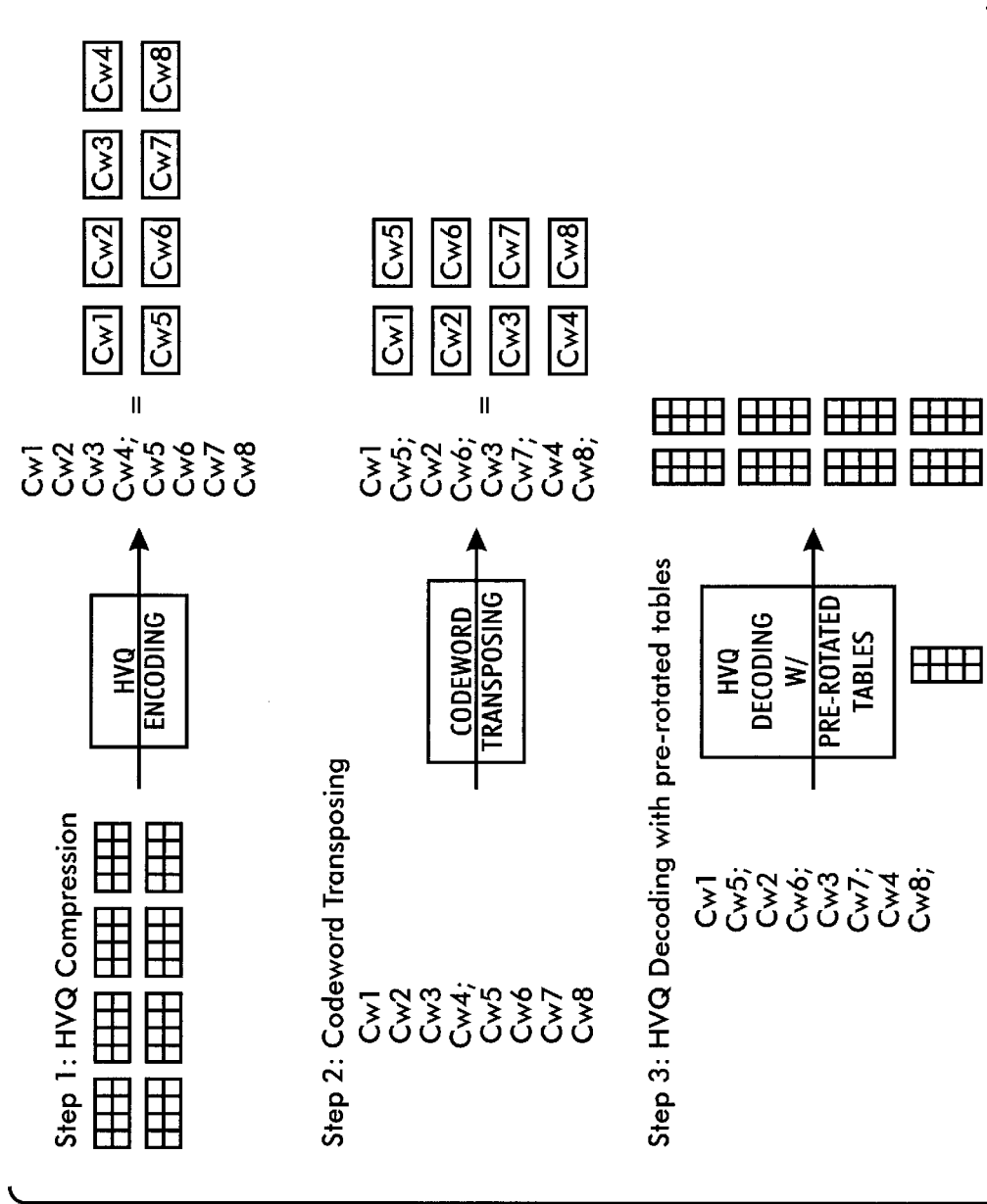
FIG. 7 shows three processes of rotating or mirror imaging an image using HVQ compression.

HVQ compression is easily adapted to image rotation and mirror imaging as shown in FIG. 7. The process is shown here using the example of an original image that is four pixels high and sixteen pixels wide, and must be rotated ninety degrees clockwise and mirror imaged.

Step 1 is the usual compression process of reducing the eight 8-pixel segments to eight codewords Cw1 to Cw8. Step 2 is the step of rearranging the codewords into the rotated and mirror imaged order. This hardware can be in the form of wiring where the second word in, for example Cw2, is connected to the third word out, as shown. Step 2 can have several sets of wiring, each set delivering a different rotation. Finally, decoding step 3 uses a look-up table to produce a pixel pattern for each segment that is properly oriented. Here again, several tables can be used to produce various orientations.

Printing hints may be incorporated into the original data supplied by the user in the original page description language to indicate to the printer how the data may best be printed. For example, a hint word may be two bits in length, and indicate one of four possibilities, that the following data is text, contone, graphics, etc. For example, if the printer is receiving data that originated as a computer generated graphic it may use a different halftone screen than it would if the original data was screened in from a photograph.

Printing hints may be added to any HVQ channel as shown in FIG. 5. Assume that for each 4 pixel block entering into the HVQ encoder 54 there is produced one codeword 9 bits in length, contained in two 8-bit bytes, so that the first 8 bits are contained in the first byte and the last bit is contained in the second byte. Then the 2-bit hint is added.

Now, each codeword plus hint is 11 bits, still contained in two bytes. The LZ encoder looks at a string of bytes, perhaps 256 bytes in length, and determines the location and size of the most recent identical pattern match. To the extent that the hint changes once or twice within that string, there will be a slightly decreased amount of compression in comparison to the amount that would have resulted with no hints. However, to the extent that the hint does not change during that time, there is no decrease in compression at all. The result is that printing hints can be supplied after an HVQ compressor but before the lossless compressor with very little effect on the compression ratio. At the output side, after the code words are LZ decompressed, but before being decoded, the hints can be extracted for later use.

The losses of an HVQ compressor can be further minimized by choosing codewords and output data patterns that have the best chance of matching the actual input data patterns. For example, first consider text. If text pixels are being encoded in 4 by 2 pixel groups, and the four input pixels in one line are black, dark gray, light gray and white, and the input video was scanned-in text, the data most likely originally was a boundary between a black letter and a white space, so the output pixel pattern could be black, black, white, white. On the other hand, if the original input data was a scanned-in computer generated graphic, the four pixels are more likely to be a smooth decrease in density from black to white. The actual determination of the encoder codewords and patterns in the decoder look-up table are determined by statistical analysis. A representative group of text and graphic documents are passed through a test program and the best values are generated for each type.

A complication arises when a boundary passes through an input block of pixels, in which case neither text nor graphic values can be used for the entire block. The solution is to supply a third set of codewords and patterns which are generated specifically for this boundary condition. In this case a set of documents containing both text and graphics would be analyzed to produce one set of patterns, which would be used when a boundary, mixed, condition is determined to be within the block.

The boundary condition is sensed by observing the printing hints. For example, a rectangular scanned-in picture is typically located on a page of text by its x,y coordinates. When the raster output scanner beam is within the coordinates, the printing hints will indicate to the printer which codewords, look-up table entries and halftone screens to use. If the hint changes from picture to text within the block, for example, then the encoder knows that a boundary exists within the block.

Figure 8:
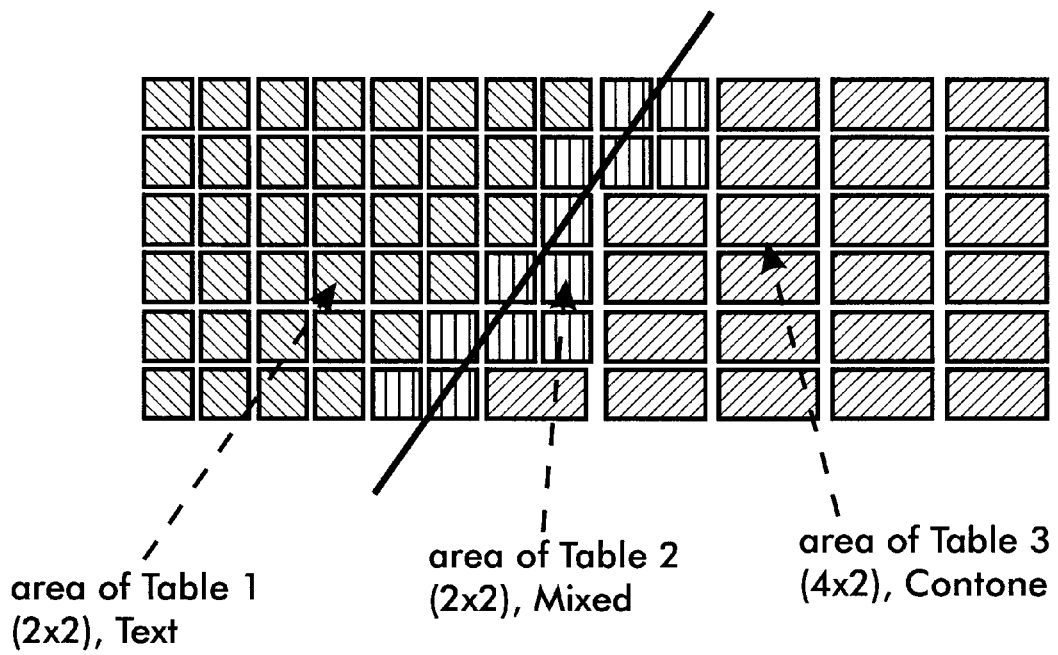
FIG. 8 shows a boundary between blocks of different sizes.

In all cases the block size must be maintained. FIG. 8 is an example of a transition between text and contone. Since different block sizes can be used in HVQ encoders for different kinds of data, the block size for the text is shown here as 2 by 2 pixels to allow greater edge detail while the block size for contone is shown as being 4 by 2 to allow for greater compression.

Figure 9:
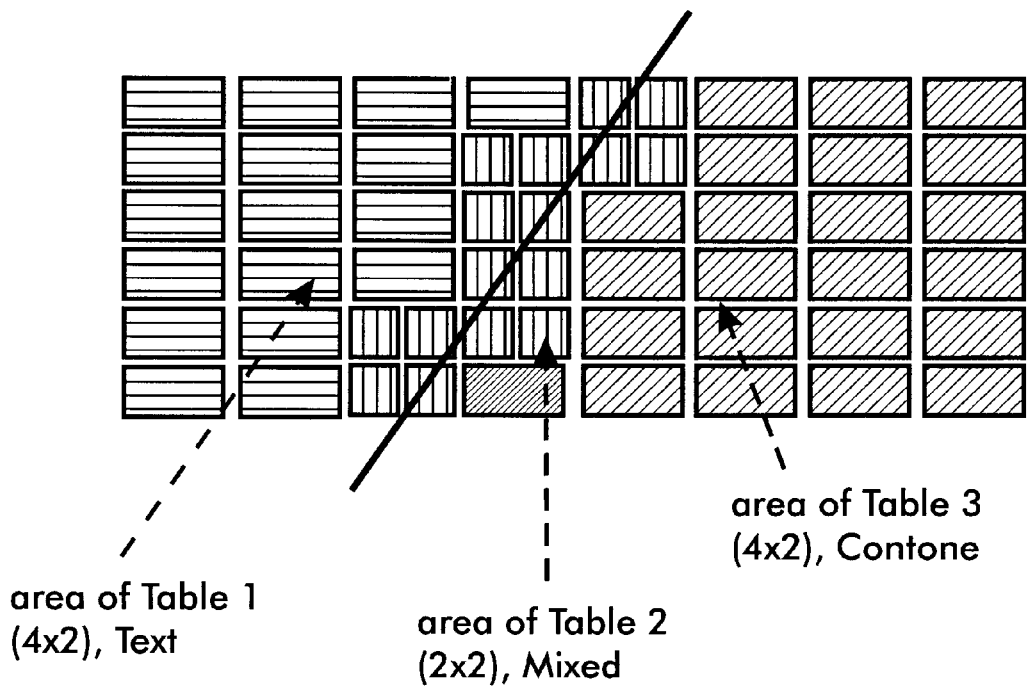
FIG. 9 shows a boundary between blocks of the same size.

If a boundary is within a 2 by 2 pixel block, that block is encoded and decoded using boundary values. In addition, any contone pixels to the right of the boundary such as pixel 81 are also treated as a boundary pixels if necessary so that all remaining pixels to the right of the boundary line will be within 4 by 2 pixel blocks. Similarly, in FIG. 9, showing a boundary between 4 by 2 pixel blocks of text and contone, 2 by 2 pixel boundary blocks are used in pairs so that all remaining blocks will be 4 by 2.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A process of compressing an original word having a plurality of bits comprising the steps of:

splitting the word into the most significant bits and the least significant bits, first compressing the least significant bits in a first lossy compressor, second compressing the most significant bits in a second lossy compressor, wherein the first and second compression ratios are different, and combining the compressed most and least significant bits to form an output word.

2. The process of claim 1 further comprising the step of losslessly compressing the results of the two compressing steps before combining to form the output word.

3. The process of claim 1 wherein one compressing step uses hierarchical vector quantization.

* * * * *